United States Patent
Nassor et al.

(10) Patent No.: US 8,094,578 B2
(45) Date of Patent: Jan. 10, 2012

(54) METHOD OF PREDICTING THE TRANSMISSION ERROR RATE IN A COMMUNICATION NETWORK AND SERVER IMPLEMENTING SUCH A METHOD

(75) Inventors: Eric Nassor, Thorigne Fouillard (FR); Frédéric Maze, Langan (FR); Hervé Le Floch, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 12/555,687

(22) Filed: Sep. 8, 2009

(65) Prior Publication Data

US 2010/0061251 A1      Mar. 11, 2010

(30) Foreign Application Priority Data

Sep. 8, 2008   (FR) ...................................... 08 56017

(51) Int. Cl.
   *H04L 1/00* (2006.01)
(52) U.S. Cl. ..................................................... 370/252
(58) Field of Classification Search .......... 370/229–235, 370/252, 394, 468–473; 709/219–224; 714/752–776; 725/93–95, 105–126
   See application file for complete search history.

(56) References Cited

U.S. PATENT DOCUMENTS

| | | | |
|---|---|---|---|
| 7,099,954 B2 * | 8/2006 | Li et al. | 709/233 |
| 7,260,826 B2 * | 8/2007 | Zhang et al. | 725/94 |
| 7,304,951 B2 * | 12/2007 | Rhee | 370/235 |
| 7,394,762 B2 * | 7/2008 | Leith et al. | 370/229 |
| 7,447,235 B2 * | 11/2008 | Luby et al. | 370/476 |
| 2005/0114386 A1 | 5/2005 | Nassor | |
| 2005/0198118 A1 | 9/2005 | Viger | |
| 2005/0278389 A1 | 12/2005 | Maze | |
| 2008/0084821 A1 | 4/2008 | Maze | |
| 2008/0123560 A1 | 5/2008 | Nassor | |
| 2008/0294789 A1 | 11/2008 | Nassor | |
| 2009/0210765 A1 | 8/2009 | Henocq | |

OTHER PUBLICATIONS

U.S. Appl. No. 12/514,307, filed Jul. 22, 2009.
L. Roychoudhuri, et al., "Real-Time Packet Loss Prediction Based on End-to-end Delay Variation", IEEE Transactions on Network and Service Management, vol. 2, No. 1, Third Quarter 2005.
Benyuan Liu et al., "TCP-Cognizant Adaptive Forward Error Correction in Wireless Networks", Globecom'02 2002, IEEE Global Telecommunications Conference, Nov. 17-21, 2002.
Chen R. et al., "Adaptive Error Coding Using Channel Prediction", Wireless Networks, ACM, vol. 5, No. 1, Jan. 1, 1999.
Chen S-C et al., "An Adaptive rate-control streaming mechanism with optimal buffer utilization", Journal of Systems & Software, vol. 75, No. 3, Mar. 1, 2005.
Roychoudhuri L. et al., "On the impact of loss and delay variation on Internet packet audio transmission", Computer Communications, vol. 29, No. 10, Jun. 19, 2006.
French Preliminary Search Report issued in French application 0856017on Jun. 18, 2009 (to provide explanation of relevance).

* cited by examiner

*Primary Examiner* — Frank Duong
(74) *Attorney, Agent, or Firm* — Fitzpatrick, Cella, Harper & Scinto

(57) ABSTRACT

To predict the transmission error rate in a stream of data packets transmitted between a server and at least one client in a communication network: the server sends at least one group of packets to the client; the client calculates a plurality of items of statistical information on the group of packets and transmits them to the server; the server analyzes the items of statistical information so as to obtain a network stability indicator; and the server calculates a prediction of the transmission error rate on the basis of the network stability indicator.

22 Claims, 9 Drawing Sheets

FIG. 10 selection of packets → reception of prediction (1010) → reliable? (1020)
- yes → fixed? (1030)
  - yes → FIFO mode (1025)
  - no → calculate FEC rate on basis of the positions (1040) → selection on basis of the position (1045)
- no → FIFO mode (1025)

METHOD OF PREDICTING THE TRANSMISSION ERROR RATE IN A COMMUNICATION NETWORK AND SERVER IMPLEMENTING SUCH A METHOD

TECHNICAL FIELD

The present invention relates to a method of predicting the transmission error rate in a communication network, as well as to a server implementing such a method.

It belongs to the field of the transport of multimedia data (audio, video, text) in packet communication networks such as the Internet or local networks of IP (Internet Protocol) type.

BACKGROUND OF THE INVENTION

In the context of multimedia transmission over the Internet or over Local Area Networks (LAN), a multimedia data server must deliver one or more data streams (of video type, audio type, or text type such as sub-titles, etc.) to one or more clients.

These clients receive and consume these data, for example by playing the video and the audio, progressively as they are received. The expression multimedia "streaming" is used.

These multimedia streams are constituted by data such as images, portions or slices of images or samples of sounds a characteristic of which is to have a limited useful life, that is to say that these data must imperatively be received and processed by the receiving peripheral before a certain time limit. This time limit corresponds to the time at which the item of data is required to be displayed or played by the client. Beyond that time limit, the data becomes useless and is purely and simply ignored by the client.

To limit the rate of the data and so obtain rates compatible with that of the underlying network, these various data streams are generally compressed, for example, for video, in accordance with the MPEG 2 or MPEG 4 part 2 or H.264 compression standards and for example, for audio, in accordance with the AMR, G.711, G.722.1, AAC compression standards. These are lossy compression standards: the compression is very efficient, but the stronger it is, the more the item of multimedia data is degraded.

Increasing amounts of equipment available for the general public meet this definition and are capable of sending such data streams: this is the case for camcorders, photographic cameras, video surveillance cameras, home video servers, TV receivers, computers and telephones. The multimedia streams (video, audio, text) intended to be sent may be stored and compressed in advance on the sending apparatus or on the contrary be captured, compressed and sent over a communication network to a receiving apparatus.

These multimedia streams are transmitted over communication networks constituted by interconnection nodes (routers, switching devices, etc.) in order to convey the data packets coming from source devices to recipient devices. They share these networks with other data streams (for example Internet browsing, a video game, the transfer of a file to a printer, etc.). All these data stream are liable to create congestion on the communication networks when they pass via the same network link of insufficient capacity. The excess packets generally end up being rejected by the interconnection node situated at the input to the link.

The structure of the network is not known by the sending and receiving devices. Similarly, the streams present do not know each other and their number and their behavior may be very variable over time.

Conventionally, the servers and the clients use communication protocols implementing control mechanisms in order to avoid continuously losing a high quantity of data in case of congestion. They make it possible to detect the appearance of a congestion phenomenon on the basis of the packet losses and they act on the transmission rate of the data stream in order to reduce it or to increase it so as to be compatible with the overall bandwidth of the network.

Congestion control mechanisms generally implemented in IP networks are of TFRC (TCP Friendly Rate Control, IETF RFC3448) or AIMD (Additive Increase/Multiplicative Decrease, IETF RFC2581) type.

For example, the AIMD mechanism makes it possible to equitably share the available bandwidth between all the data streams: each competing stream obtains an equal share on average. AIMD is based on the use of a sliding window, termed congestion window. The size of this window determines the maximum quantity of data that the server is authorized to send immediately over the network without having to await the next acknowledgement.

The TCP protocol doubles the size of the congestion window at each RTT (Round-Trip Time) that is to say at each acknowledgement, when the congestion window is less than the slow-start threshold, and then it increases the window by one data segment for each RTT (congestion avoidance phase). If a congestion loss arises, the congestion window is reduced by half. This algorithm makes it possible to probe the available bandwidth until a loss of packets is obtained indicating a congestion on the network. A congestion loss is generally described as corresponding to a timeout or to the reception of three duplicated packets.

The congestion control mechanism thus makes it possible to reduce the traffic heaviness on the network and thus to reduce the number of congestion errors. However, it does make it possible to be totally free therefrom.

The impact of an error on a multimedia stream may be very great. This is because, due to the compression, an error in a part of a stream will propagate into the other parts of the stream. For example, if an image slice is lost, the image will of course have an incorrect part, but due to the compression by motion compensation carried out by modern video coders (MPEG standards), the following images will also be affected. It is thus important to attempt to correct these errors.

The most common technique consists of asking for the lost packets again. However, this technique cannot be used for the case where the stream is transmitted with strong time constraints, that is to say when the data must be received before a maximum time limit and if that time limit is short compared to the communication time between the client and the server (RTT). The maximum time limit is for example linked to the point in time for display of the image which is set by the display cadence of the images at the client. It is thus necessary to have recourse to a predictive method of error correction.

Predictive methods consist of coding the multimedia data and of sending them in such a manner that certain parts can be lost with a small impact on the quality of the media received and decoded.

A conventional predictive error correction method consists of creating redundancy packets, which are sent in addition to the packets of the multimedia stream. If one of the multimedia data packets is absent, the receiver may use the redundancy packets to re-create the missing packets. The redundancy packets may be created for example using XOR operations or with Reed-Solomon codes.

Another predictive method for limiting the impact of the errors consists of changing the coding of the multimedia stream, to reduce the dependency between the data. It is possible for example to reduce the number of macroblocks in an image that uses coding by motion prediction. Thus, an error is less visible since it has little chance of propagating to the following images.

In both these cases, a considerable difficulty consists in evaluating the necessary level of redundancy. This is directly linked to the error level in the network. On the one hand, if the rate of redundancy is less than the real error rate of the network, some errors will be unable to be corrected or will have a high impact. On the other hand, if the redundancy rate is too great, the server transmits information that is of no use. The available rate for the item of multimedia data is thus reduced, which forces it to be compressed more and thus degrades its quality. It is thus important to estimate the error rate as precisely as possible.

Transmission errors may have several causes: problems of physical transmission (for example, radio interference during a wireless transmission) or congestion errors. The invention is solely concerned with this second type of error.

The congestion error rate depends on several parameters: the behavior of the sender of the data (its own data may create congestions) and, furthermore, the behavior of the other data streams using the same network (the data of the other streams may also create congestions).

In a system in which no a priori knowledge about the network and about the behavior of the other streams is available, the prior art provides no method of determining the rate of correction to implement.

The invention seeks to predict the future rates of congestion errors during the transmission of the next packets of a multimedia stream to enable good adjustment of the predictive methods of error correction.

In a paper entitled "Real-Time Packet Loss Prediction based on End-to-End Delay Variation" published in IEEE Transactions on Network and Service Management, vol. 2, no. 1, November 2005, L. Roychoudhuri et al. describe a system which uses the measurements of the transmission times of the data packets to calculate a probability of error, in order to calculate a level of error correction to apply to the data to send. This system has in particular the drawback of not taking into account the impact of other streams passing over the network.

SUMMARY OF THE INVENTION

The present invention aims to mitigate the drawbacks of the prior art.

With that aim, the present invention provides a method of predicting the transmission error rate in a stream of data packets transmitted between a server and at least one client in a communication network, this method being remarkable in that it comprises the steps of:

sending by the server to the client at least one group of packets;

calculating by the client a plurality of items of statistical information on the group of packets and transmitting by the client those items of statistical information to the server;

analyzing by the server the statistical information so as to obtain a network stability indicator; and calculating by the server a prediction of the transmission error rate on the basis of the network stability indicator.

Thus, the invention makes it possible to minimize the level of redundancy in the coded data stream to obtain a good compromise between bandwidth and protection against congestion errors.

Moreover, the invention uses the data packets sent with very little additional information.

Furthermore, the invention is capable of detecting and automatically adapting to various modes of operation of the network.

In a particular embodiment, at the step of analyzing the statistical information, the server determines the position of the errors in the group of packets.

This is because the position of the errors provides good characterization of some types of network.

According to a particular feature, if the server determines that a majority of errors is situated at the end of groups, the network stability indictor indicates that the network is of stable type.

The server may thus identify that the rate of the stream is within the capacity limit of the network. This may for example be the case of a transmission over an uploading ADSL line.

According to another particular feature, if the server determines that a majority of errors is situated at the beginning of groups, the network stability indictor indicates that the network is of unstable type.

The server may thus identify the case of a stream which is competing with numerous other streams which react rapidly: for example, a long distance transmission over the Internet.

In a particular embodiment, the client calculates the capacity of the network for each packet of the group of packets, defined by $B_i = S_i/d_i$, where $S_i$ is the size of the packet and $d_i$ is the variation, between two consecutive packets, of the transmission duration of a packet.

The capacity of the network is indeed an important parameter for the phenomenon of congestion.

According to a particular feature, at the step of analyzing the statistical information, the server analyzes the variations in measurement of the capacity of the network and deduces therefrom the network stability indicator.

Even if the capacity measurement is not reliable in some cases, the fact that the measurement is unreliable itself constitutes a new piece of information as to the behavior of the network, which may be used to predict its behavior.

According to another particular feature, at the step of analyzing the statistical information, the server compares the capacity of the network with the rate of the stream over the network and deduces therefrom the network stability indicator.

The ratio between the capacity and the rate of the stream is indeed a good indicator of different types of operation of the network.

According to a particular feature, if the network stability indicator indicates that the network is of unstable type, the server calculates a prediction of the error rate on the basis of long term statistics on the number of errors in the past.

The long-term variations make it possible to obtain good indicators of future error rates when the network is unstable as seen from the server.

According to another particular feature, if the network stability indicator indicates that the network is of stable type with a share of the rate used by the stream of data packets greater than a first predetermined threshold, the server calculates a prediction of the error rate on the basis of statistics on the position of the errors in the group of packets, and if the network stability indicator indicates that the network is of stable type with a share of the rate used by the stream of data packets less than a second predetermined threshold, the server calculates a prediction of the error rate on the basis of short term statistics on the evolution of the transmission duration of the packets.

Thus, the server uses the most efficient error prediction method depending on the type of operation of the network.

According to a particular feature, the method further comprises a step of determining by the server the reliability of the prediction of the transmission error rate on the basis of the network stability indicator.

More particularly, according to the types of network and the methods of calculation, the predicted error rate is of higher or lower reliability. This information is of interest if it is wished to use the calculated error rate.

According to a particular feature, the server selects a predictive error correction method on the basis of the prediction of the transmission error rate and of the reliability of the prediction.

The server thus adapts the error correction method, not only to the predicted error rate, but also to the confidence that may be placed in the prediction.

According to a particular feature, the server chooses a predetermined redundancy rate for an error correction method on the basis of the prediction of the transmission error rate and of the reliability of the prediction.

If the prediction is reliable, it is thus possible to have a level of redundancy that is fixed precisely, making it possible to correct the exact level of errors and so have an optimum transmission quality.

According to a particular feature, when the data are video data, the server chooses an intra coding mode for the data depending on the prediction of the transmission error rate and on the reliability of the prediction.

More particularly, if the prediction is not reliable, a method making it possible to have a progressive and non-abrupt degradation of the quality is preferable.

With the same aim as that indicated above, the present invention also provides a server for transmission of a stream of data packets, in a communication network comprising at least one client, said server being remarkable in that it comprises:
a module for sending at least one group of packets to the client;
a module for receiving a plurality of items of statistical information on the group of packets;
a module for analyzing that statistical information so as to obtain a network stability indicator; and
a module for calculating a prediction of the transmission error rate on the basis of the network stability indicator.

Still with the same aim, the present invention also concerns an information storage means which can be read by a computer or a microprocessor storing instructions of a computer program, remarkable in that it makes it possible to implement a prediction method as succinctly described above.

Still with the same aim, the present invention also concerns a computer program product able to be loaded into a programmable apparatus, remarkable in that it comprises sequences of instructions for implementing a prediction method as succinctly described above, when that program is loaded and executed by the programmable apparatus.

As the particular features and the advantages of the server, of the information storage means and of the computer program product are similar to those of the prediction method, they are not repeated here.

BRIEF DESCRIPTION OF THE DRAWINGS

Other aspects and advantages of the invention will appear from reading the following detailed description of particular embodiments, given by way of non-limiting example. The description refers to the accompanying drawings, in which:

FIG. 10 is a flowchart illustrating the main steps of the packet selection that is carried out by the packet scheduler in accordance with the present invention, in a particular embodiment.

DETAILED DESCRIPTION OF THE INVENTION

Figure 1:
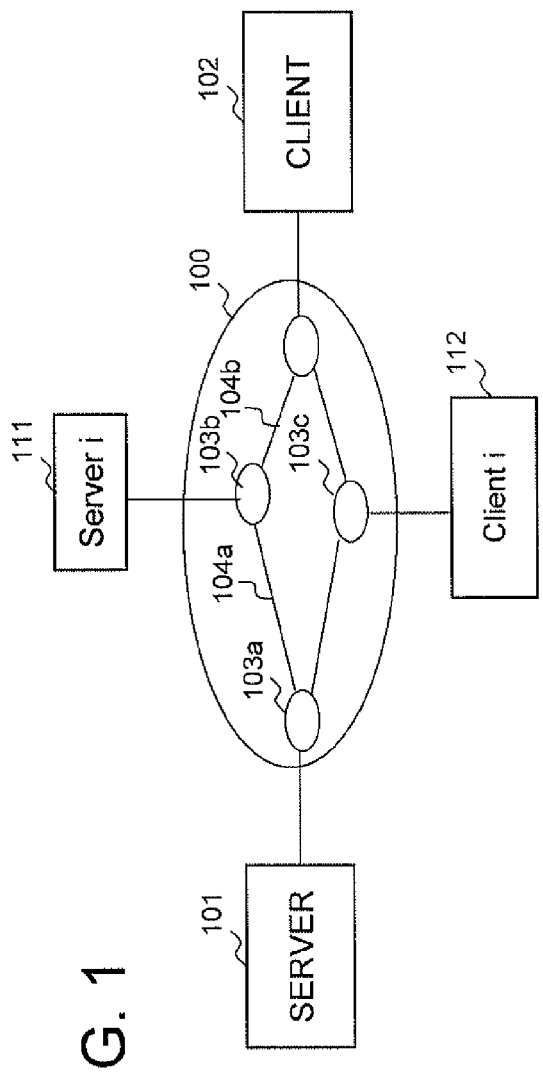
FIG. 1 is a diagram of a data communication network of distributed type which may implement the present invention, in a particular embodiment.

FIG. 1 shows a data communication network example in which the present invention may be implemented. A sending device or server 101 transmits data packets of a data stream to a receiving device or client 102 across a data communication network 100. The network 100 may contain interconnection nodes 103a, 103b (also termed routers) and links 104a, 104b which create paths between the sending and receiving devices. The same network may be used by numerous server and client devices 111, 112 implementing the invention or not.

The interconnection nodes receive the packets, temporarily store them in a local memory then re-transmit them as soon as possible over an output link.

The interconnection nodes 103 and the receiving device 102 may reject data packets in case of congestion, that is to say in case of overflow of the reception memory.

The congestions may have different causes:
On the one hand all the links do not have the same capacity: some links may have a higher rate than the following link. If for example the link 104a has a rate of 1 Gb/s whereas the link 104b only has a rate of 100 Mb/s, the router 103b, once its reception memory is full, will be obliged to delete certain packets. For this case to occur, it suffices for the server 101 to transmit data too fast.
On the other hand, the capacity of the links entering a router may be greater than the capacity of an outgoing link. If for example the packets sent by the servers 101 and 111 use the same link 104b, if the combined rate of the two servers is greater than the capacity of the link 104b, the router 103 will reject certain packets. In this case, congestion is created by all the streams using the network. Depending on the network, the number of competing streams over the same path may sometimes by very great; over the Internet several tens or hundreds of streams may be in competition.

The network 100 may be for example a wireless network of WiFi/802.11a or b or g type, or an Ethernet network, or, like the Internet, it may be composed of links of different types.

The sending device 101 may be any type of data processing device able to code and supply a data stream to a receiving device. By way of example that is in no way limiting, the sending device 101 may be a stream server capable of supplying a content to clients on demand, for example using the RTP protocol (Real-time Transport Protocol) over UDP (User Datagram Protocol) or DCCP (Datagram Congestion Control Protocol) or any other type of communication protocol.

The sending device 101 may implement a congestion control algorithm of the type mentioned above, i.e. TFRC or AIMD.

The receiving device 102 receives the data, decodes them and displays them with a low latency.

The sending device 101 and the receiving device 102 may equally well be for example of the type represented in FIG. 2, described below.

Figure 2:
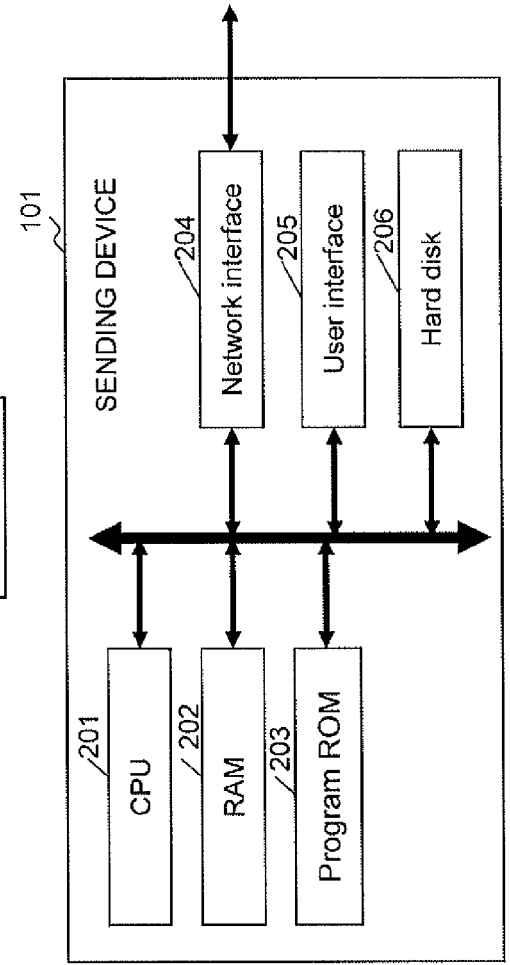
FIG. 2 is a diagram of a particular embodiment of a sending device adapted for implementing the present invention.

FIG. 2 does indeed illustrate in particular a sending device 101 or receiving device 102 adapted to incorporate the invention, in a particular embodiment.

Preferably, the sending device 101 comprises a central processing unit (CPU) 201 capable of executing instructions coming from a read only memory (ROM) 203 for programs on powering up of the sending device, as well as instructions concerning a software application coming from a main memory 202 after powering up.

The main memory 202 is for example of random access memory (RAM) type and operates as a working zone of the CPU 201. The memory capacity of the RAM 202 may be increased by an optional RAM connected to an extension port (not illustrated).

The instructions concerning the software application may be loaded into the main memory 202 from a hard disk 206 or else from the program ROM 203 for example. Generally, a means for storing information which may be read by a computer or by a microprocessor, is adapted to store one or more programs of which the execution enables the implementation of the method according to the invention. This storage means is integrated into the device 101 or not, and may possibly be removable. The execution of the program or programs mentioned above may take place for example when the information stored in the storage means are read by the computer or by the microprocessor.

Figure 5B:
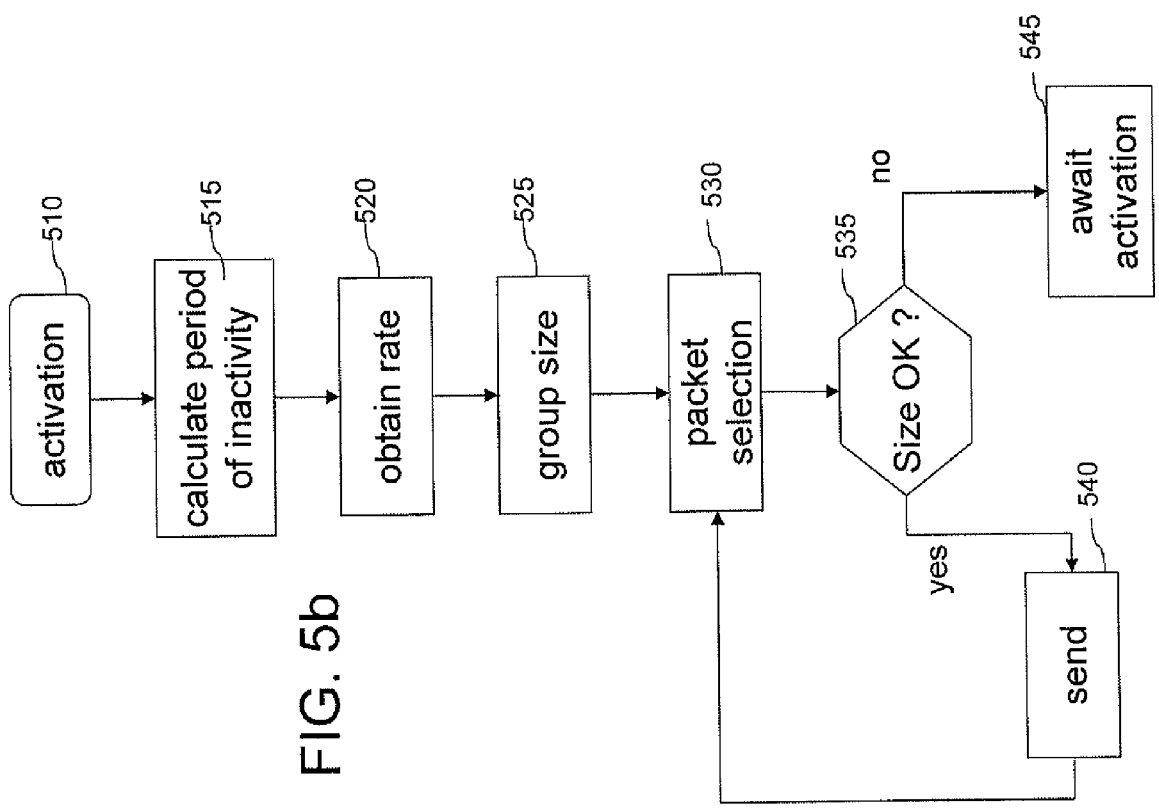
FIGS. 5a and 5b diagrammatically illustrate the scheduling of the packets that is implemented in the context of the present invention, in a particular embodiment.
Figure 5A:
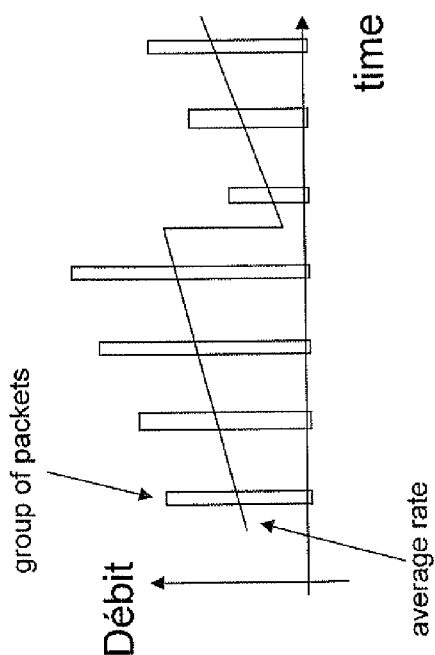
Figure 6B:
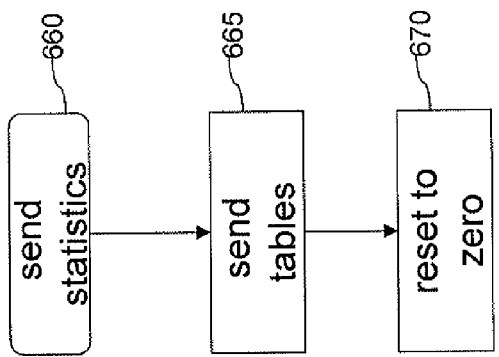
FIGS. 6a and 6b diagrammatically illustrate the production of statistics that is implemented in the context of the present invention, in a particular embodiment.
Figure 6A:
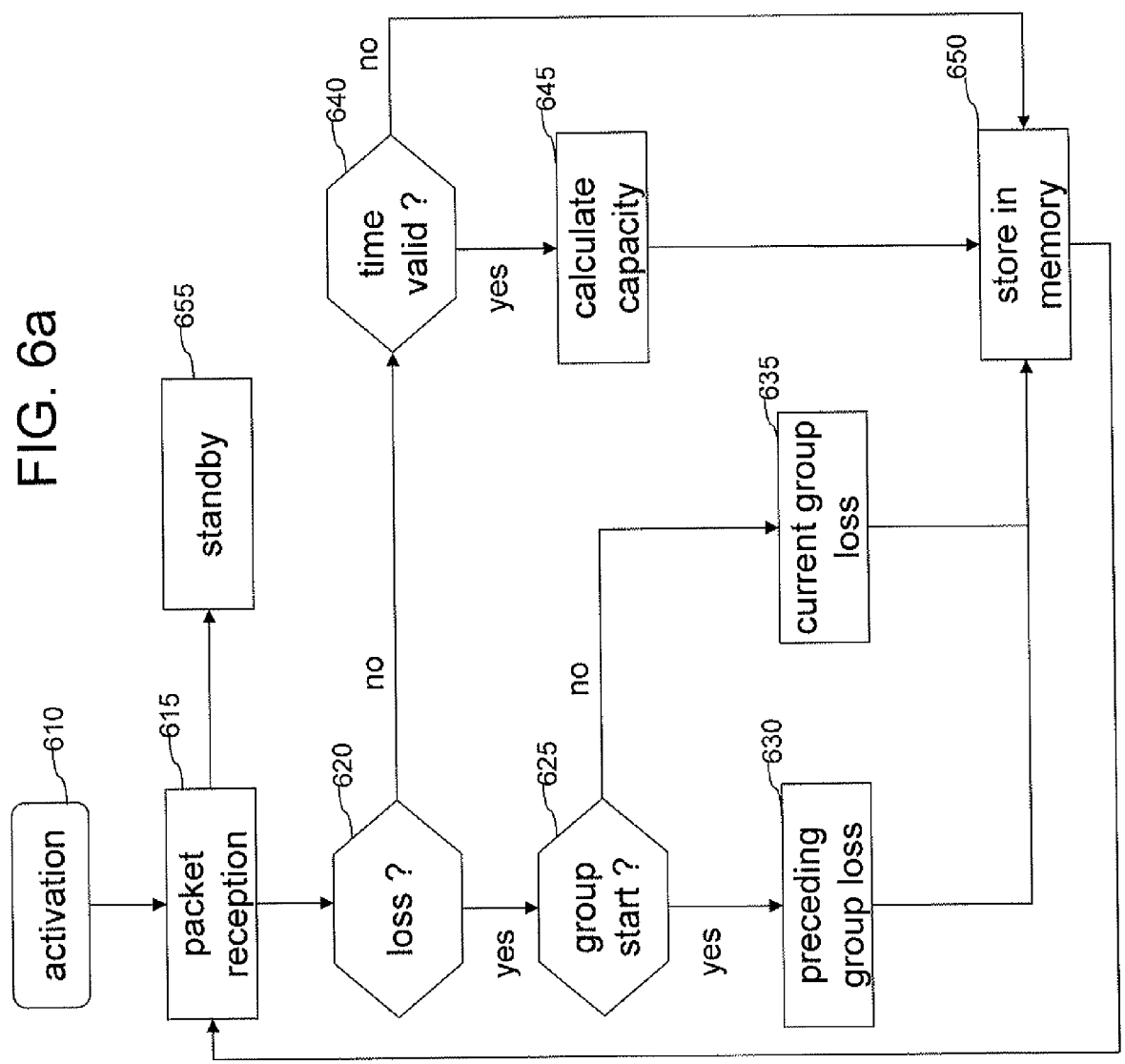

When the software application is executed by the CPU 201, it leads to the execution of the steps of the flowcharts of FIGS. 5a and 5b, 7, 9 and 10 on the server and of FIGS. 6a and 6b on the client.

The sending device 101 or receiving device 102 further comprises a network interface 204 which enables its connection to the communication network 100. When the software application is executed by the CPU 201, it is adapted to react to packets coming from other devices 101 and 102, received by means of the network interface 204 and to supply packets to other devices 101 and 102 via the network.

The sending device 101 or receiving device 102 comprises in addition a user interface 205, constituted for example by a screen and/or a keyboard and/or a pointing device such as a mouse or optical stylus, to display information for a user and/or receive inputs from that user. This interface is optional.

A sending apparatus is for example a micro-computer, a workstation, a digital assistant, a portable telephone, a digital camcorder, a digital photographic camera, a video surveillance camera (for example of webcam type), a DVD reader, a multimedia server or a router element in a network. This apparatus may directly incorporate a digital image sensor, or it may optionally be connected to different peripherals such as a digital video camera (or a scanner or any means for image acquisition or storage) connected to a graphics card and supplying the apparatus with multimedia data. The sending apparatus may also have access to multimedia data on a storage medium (for example the hard disk 206) or may receive a multimedia stream to process, for example coming from a network.

A receiving apparatus is for example a television, a microcomputer, a video projector, or a set top box linked to a screen. This apparatus may integrate a device for reproduction of the media (screen or loud speaker) or be connected to such a device.

Figure 3:
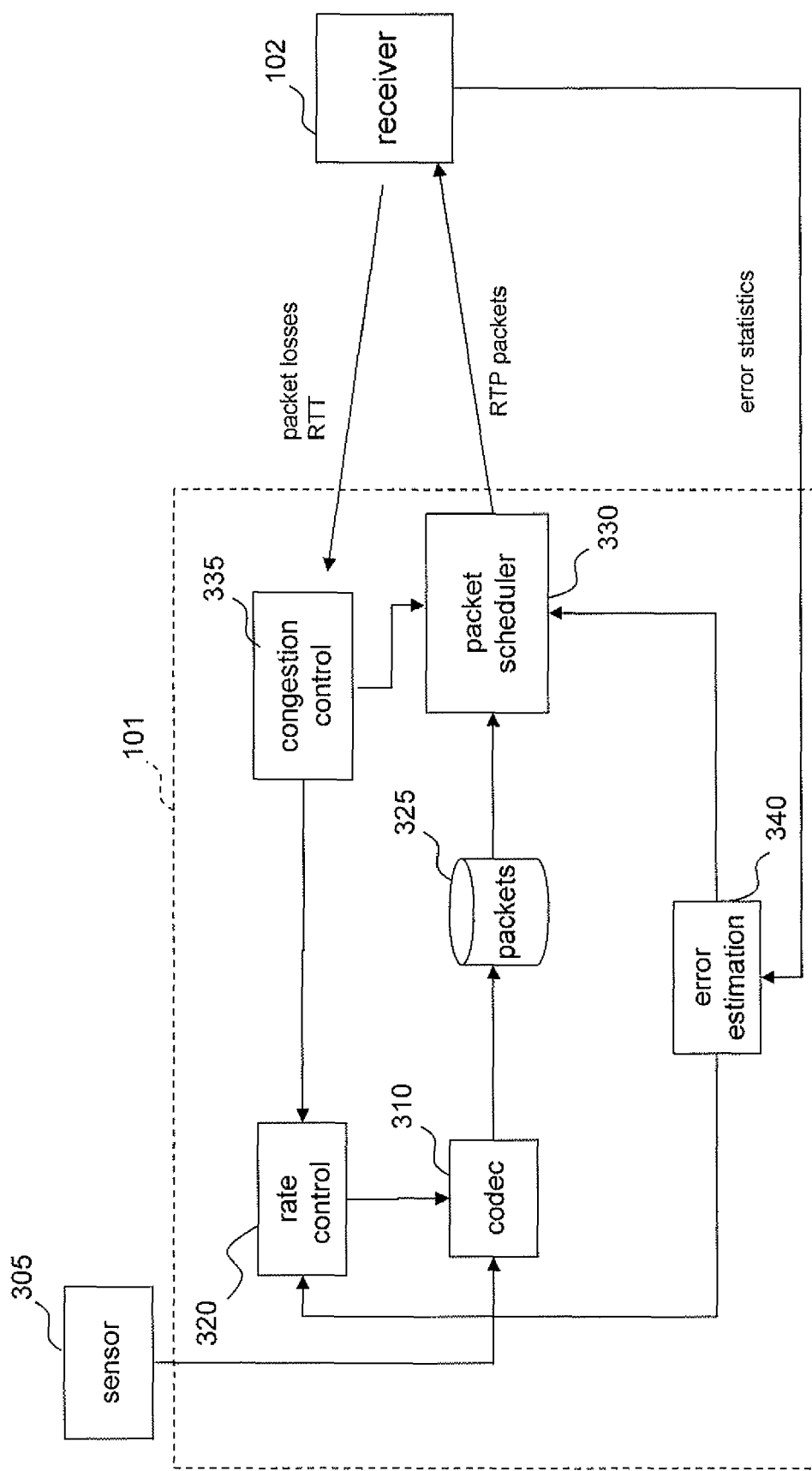
FIG. 3 is a diagrammatic representation of the architecture of a server which may implement the present invention, in a particular embodiment.

FIG. 3 illustrates the operational architecture of the server 101, in a particular embodiment.

In the example that is in no way limiting in which the data considered are video data, the server has available a video as input coming for example from a sensor 305 (for example a camera). The video is supplied to a video coder or codec 310 which codes the video in a known format (for example H.264) before storing the result in a buffer memory or buffer 325 in the form of packets ready to be sent.

As a variant, the server may receive a video that is already coded coming from another network, for example in the case of a home gateway receiving a television channel by the Internet. The codec 310 enables the video to be transcoded to adapt its rate to the bandwidth to the network at home, which is for example a wireless network. As in the first case, the data created are stored in the buffer 325.

The codec 310 is controlled by a rate control module 320. Module 320 determines the quantity and the type of data that the coder 310 may produce. For this, conventionally, it uses the network rate information coming from a congestion control module 335, as well as the error rate predicted by an error estimation or evaluation module 340. The rate control module 320 calculates the proportion of the rate which must be allocated to the redundancy to add to the media. It may also choose the type of redundancy: for example, Reed-Solomon code or fountain code or coding mode for the video preserving redundancies by increasing for example the proportion of intra macroblocks.

The packets stored in the buffer 325 are read and sent over the network by a packet scheduler module 330 given the task of sending the packets. The operation of the module 330 is described in more detail below with reference to FIG. 5b. The packet scheduler module 330 decides on the sending times of the packets depending on the instantaneous rate calculated by the congestion control module 335.

Figure 4:
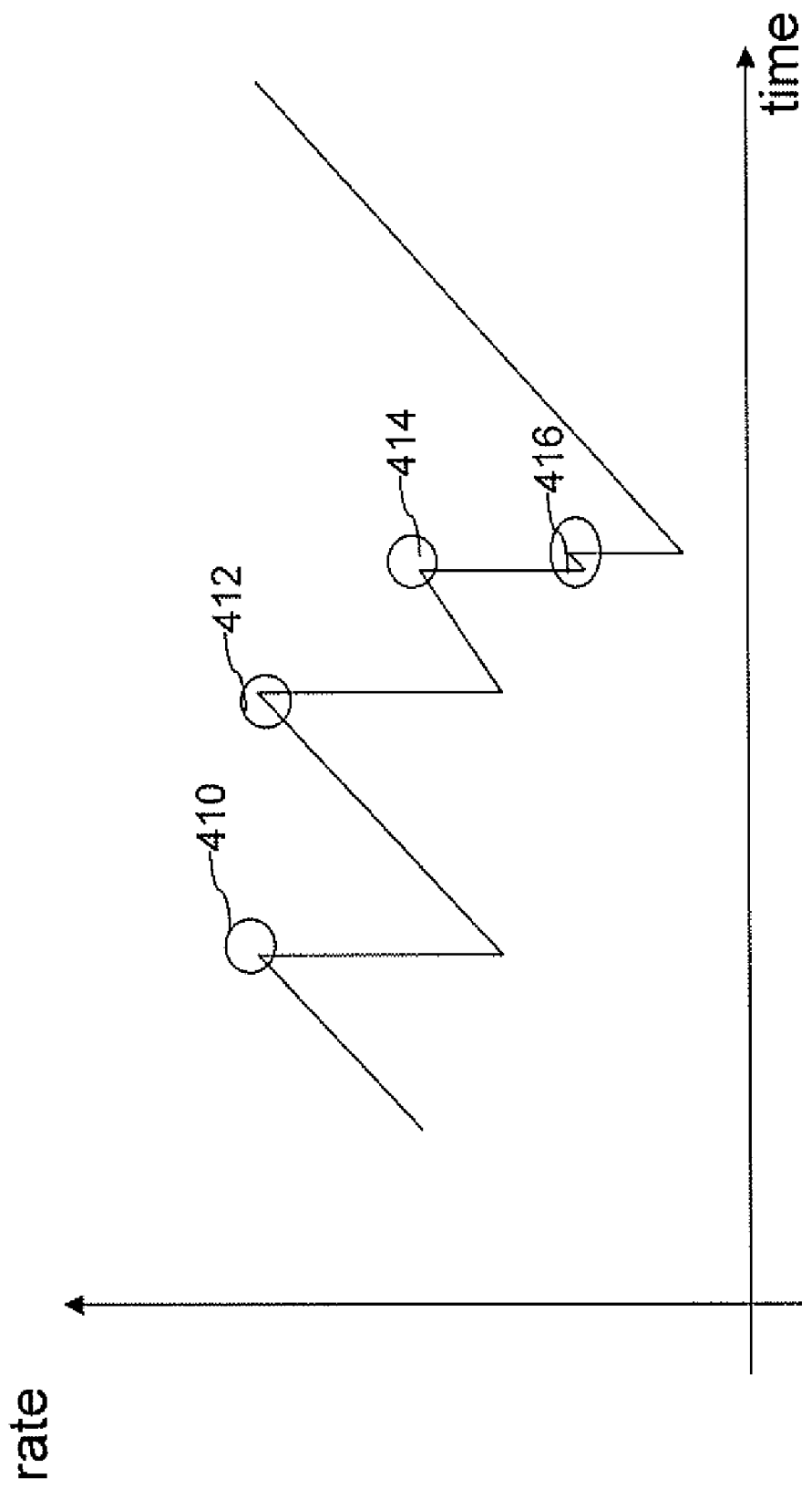
FIG. 4 is a graph illustrating a non-limiting example of congestion control implemented in the context of the present invention.

The congestion control module 335, described in more detail below with reference to FIG. 4, calculates the rate available on the network. To perform these calculations, the module 335 uses the information received from the client across the network, among which are the packet loss events and the round-trip time over the network (RTT). This information is calculated by the receiver 102 and may be transmitted conventionally using the RTCP messages of the RTP protocol.

Other information on error statistics is also calculated by the client (as described in more detail below with reference to FIG. 6) and transmitted to the error estimation module 340. Module 340 uses this error statistics information to calculate a prediction of the future error rates and their reliability, as described in more detail below with reference to FIG. 7. This information is then transmitted to the rate control module 320

Figure 9:
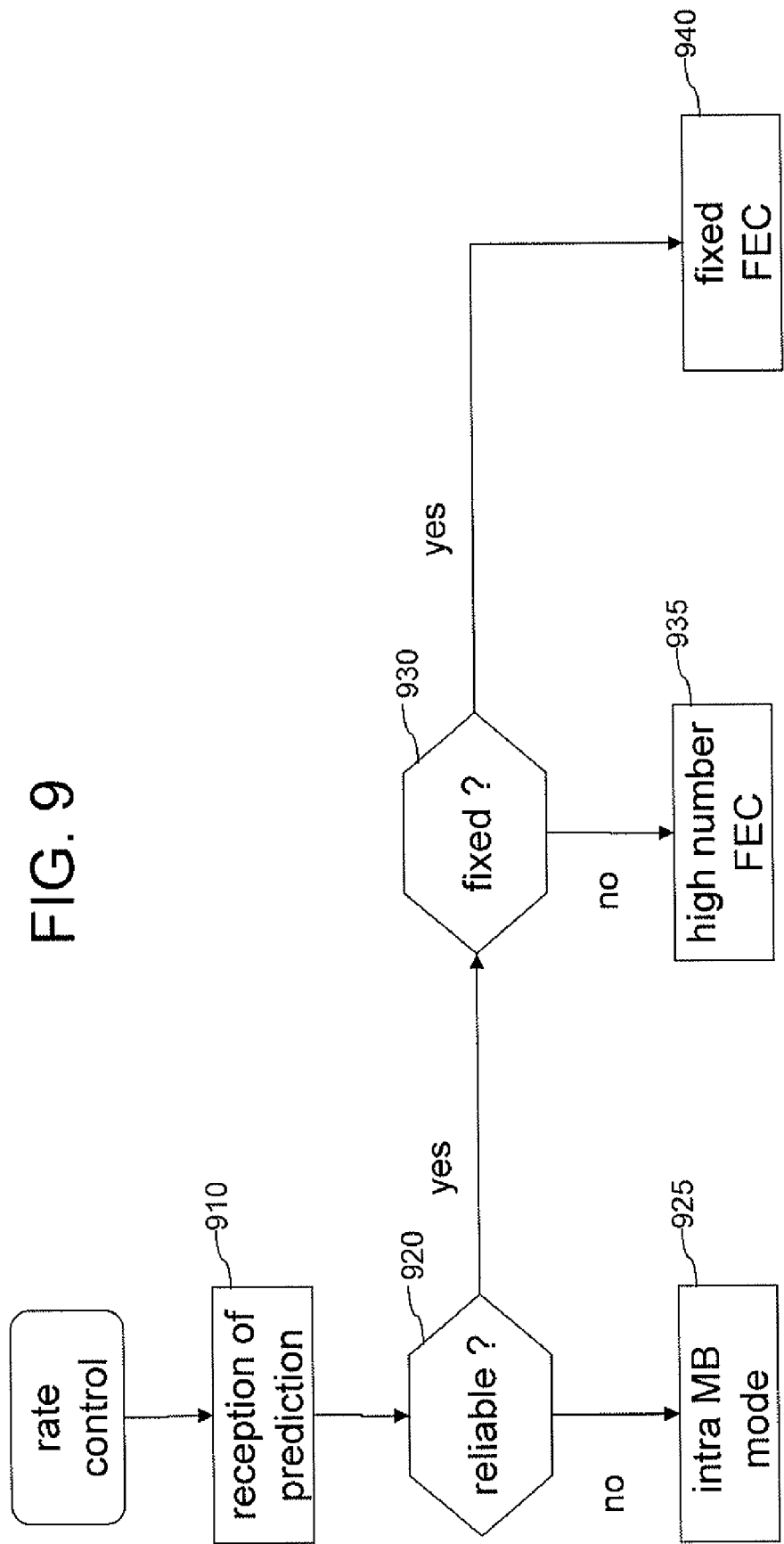
FIG. 9 is a flow chart illustrating the main steps of the rate control implemented in the context of the present invention, in a particular embodiment.

(as illustrated in FIG. 9 described later) and to the packet scheduler module 330 (as illustrated in FIG. 10 described later) to adapt the data sent.

The congestion control module 335 calculates the quantity of data sent at each instant over the network. As a matter of fact, if all the data packets composing an image were to be sent within a very short time, it is likely that a congestion of the network would be created. It is thus desirable to smooth the sending of the data packets, to avoid sending too many packets simultaneously. It is also appropriate to adapt to the state of congestion of the network by varying the number of packets sent.

The best known congestion control is that of TCP, which is of AIMD type. This algorithm operates by progressively increasing the rate of the data sent for as long as the client signals that the packets have indeed been received and for as long as the rate of the data sent is less than the rate of the data produced.

On average, TCP sends one additional packet for each correct round trip, which gives a linear increase in the rate of the data sent. When an error appears, this means that the network is congested; in reaction the rate is divided by two. This operation is illustrated in the graph of FIG. 4, which represents the rate against time. When there are no losses, the rate increases linearly. The loss events 410, 412, 414, 416 cause a drop in the available rate. There may sometimes be several loss events very close together and thus falls that are very large and rapid.

Due to the transmission time of the packet and the time to receive the information if the packet has indeed been received, AIMD has a behavior tightly linked to the round-trip time of the network (RTT). In a local network or at a short distance, the RTT may be very low, typically of the order of 0.1 millisecond. It is thus possible to have very fast variations of network rate in comparison to the speed of the coder (for example, one image every 40 ms).

It may be noted that due to its speed of variation closely related to the RTT, congestion control provides an equal sharing of the rates only between the streams having the same RTT.

Like AIMD, an algorithm of TFRC type operates by also using the packet loss events and a calculation of RTT. It calculates the rate by using an equation which must give a rate comparable to that of TCP with an equivalent RTT, but with variations that are smoothed more.

In both cases, the congestion control module 335 receives control information from the client enabling it to calculate the rate of losses or the loss events as well as the RTT.

Using this information, it calculates an available network rate. It may thus inform the packet scheduler module 330 of the rate available on the network.

The rate information is also sent to the rate control module 320 in order for the coder 310 to be able to use it to adapt the size of the next images. If the network rate is greater than the maximum rate of the coder, the latter remains at its maximum rate.

The packet scheduler module 330 uses the rate information calculated by the congestion control module 335 to decide on the sending times for the packets.

An ideal solution, for the packet scheduler module 330, consists of being activated at the specific time of the sending of the next packet. This ideal solution can be achieved if a very precise clock is available or if the packet scheduler module 330 can be activated by the reception of a packet from the network or if the packet scheduler module 330 can be continuously active and thus use the entire available calculation time of the CPU 201.

Unfortunately, in practice, in the case of an application for streaming over RTP on a real machine of PC type with a operating system which is not real-time, the scheduling process must share the available calculation time with other modules (for example the rate control module 320, the congestion control module 335 and/or the codec 310) and with other applications and it cannot thus be activated at a precise time. The clock available to activate a process has a resolution of the order of 1 ms. It is to be noted that this activation clock is different from the clock enabling the time to be measured, which may be very precise, with a resolution of several microseconds.

FIGS. 5a and 5b illustrate a mechanism making it possible to obtain an average rate equal to the rate calculated by the congestion control module 335.

The result of the execution of the scheduling algorithm is represented in FIG. 5a. Groups of packets are rapidly sent and are separated by variable intervals of time. The size of each group is calculated on the basis of the time between two groups of packets and on the basis of the rate calculated by the congestion control module 335.

As the flowchart of FIG. 5b shows, at step 510, the packet scheduler module 330 is activated by a clock after a waiting time. Next, step 515 consists of measuring the time passed since the last activation. For this, the current value of the clock for measuring the time is read and this value is compared to the time at which the last activation occurred. In practice, on a PC with Windows XP or VISTA in multimedia mode, it is possible to obtain a value of inactivity period close to 2 ms.

The value of the rate calculated by the congestion control module 335 is next read at step 520: for example, 40 Mb/s is a realistic value for the maximum rate of a high definition video stream of good quality.

It is thus possible to calculate the size of the group of packets to send, at a step 525. In the above example, for a rate of 40 Mb/s and 2 ms since the last activation of the packet scheduler module 330, it is necessary to obtain a group of 80 kb. If the packets have an average size of 1000 bytes, the group will thus have a size of 10 packets. The current number of packets n is set to 0.

At step 530, the next packet to send is selected. It is possible for example to choose the oldest packet that is waiting. Other methods of selecting the packets, taking into account errors, will be seen later, with reference to FIG. 10. Where no further packet is available, step 545 may be proceeded to directly to stop the sending of the group. In this case, the congestion control module 335 is informed that there are no further packets available, in order that it does not increase the calculated network rate.

At the issue of step 530, it is verified at a test 535 whether the sum of the total size of the packets already sent in the group and the size of the new packet is less than the target size.

If the size is smaller (test 535 positive), the packet may be sent (step 540). At the time of the sending, the packet i is marked with:
  the sequence number $s_i$, incremented with each packet,
  the order number $n_i$ in the group (the current size of the group n),
  the sending time $T_i$ (the current time).

The current size of the group n is incremented. This information will then be used on reception to calculate the characteristics of the network. Step 530 of selecting the next packet is then returned to.

If, at test 535, the size of the selected packet is too great (test 535 negative), the packet is not sent. The processing of the group of packets is terminated. The packet scheduler module 330 then stops until the next activation.

In the particular embodiment described above, all the packets are sent in groups of packets. As a variant, it may be provided for certain packets to be sent continuously with a precise calculation of the sending time and that from time to time, for a group of packets to be sent, with the aim of obtaining information on the behavior of the network.

The client calculates several statistics on the receptions of packets: the number of packets received at each position in the group of packets (stored in a table denoted rec[pos]), the number of losses at each position (stored in a table denoted loss[pos]) and the estimations of capacity of the network (stored in a table denoted nb[capa]). It also calculates the total number of losses P and the current duration of transfer D.

As the flowchart of FIG. 6a shows, the reception of a first packet at the client activates the algorithm at step 610.

Step 615 is next proceeded to in order to receive the packet. If the packet is already waiting in the buffer of the network card, the reception time is not valid: this is because it is not possible to have a precise measurement of the reception time. If no packet is yet ready, the next packet is actively awaited (that is to say using the entirety of the available calculation time of the CPU 201) for a short period (for example 0.1 ms). If at the end of this period no message is ready, the algorithm goes into standby (step 655) to enable other modules and/or other applications to use the CPU 201. If a message arrives during the standby, it is marked with the precise arrival time. A packet i thus has four associated values:

the sequence number $s_i$,
the order number $n_i$ in the packet,
the sending time $T_i$,
the reception time $t_i$.

Test 320 is then proceeded to, which consists in verifying that no packet has been lost ($s_i = s_{i-1}+1$). If at least one packet has been lost (test 620 positive), the total number of losses P is incremented and step 625 is proceeded to in order to evaluate the position of the loss.

If the current packet is at the group beginning ($n_i=0$) the loss is estimated over the preceding group (step 630, when test 625 is positive). In this case, the number of losses is incremented to the position which follows the preceding received packet (loss[$n_{i-1}+1$]++). In this simple version of the algorithm, the sequences of lost packets are not measured correctly. If several consecutive packets are lost, only the first is taken into account.

If the test 625 shows that the received packet is not at the start of the group ($n_i>0$, test 625 negative) then the loss is estimated at the previous position in the same group (step 635) (loss[$n_i-1$]++).

After the steps 630 or 635, the values of the current packet are stored at step 650 then the algorithm returns to step 615 of awaiting the next packet.

If at step 620, no loss is detected (test 620 negative), test 640 is proceeded to. The validity of the reception time of the current packet $t_i$ and of the reception time of the preceding packet $t_{i-1}$ are then verified. If one of the two times is not valid (test 640 negative), the step 650 of storage in memory is proceeded to directly.

If both times are valid (test 640 positive), step 645 of calculating the capacity is proceeded to. For this, the transfer duration $D_i=t_i-T_i$ is calculated first of all. This value is stored in the variable D representing the current duration of transfer. Next the dispersion between the packets i and i−1 is calculated, defined by $d_i=D_i-D_{i-1}$. The dispersion $d_i$ thus represents the variation, between two consecutive packets, of the transfer time, that is to say the duration of transmission of a packet. The capacity is then $B_i=S_i/d_i$, where $S_i$ is the size of the packet i. The capacity value so calculated is then stored in the table nb, which is denoted nb[$B_i/Q$]++. The cell k=$B_i/Q$ is incremented, which means that the capacity B, is between k·Q and (k+1)·Q. Q enables the precision of the statistics to be adjusted. For high definition video, it is possible for example to take Q=1 Mb/s. Step 650 of storage in memory is then proceeded to.

As FIG. 6b shows, activation is regularly performed (for example once per second) of another routine of the client: the routine for sending the statistics 660. The client sends its statistics to the server (rec[pos], loss[pos], nb[capa] tables) using for example an RTCP message, at step 665. The tables are next reset to zero at step 670.

Furthermore, the client very frequently (for example once per RTT) sends the server the values of the packet losses P and the transfer duration D. The losses P are then also reset to zero at step 670.

Figure 7:
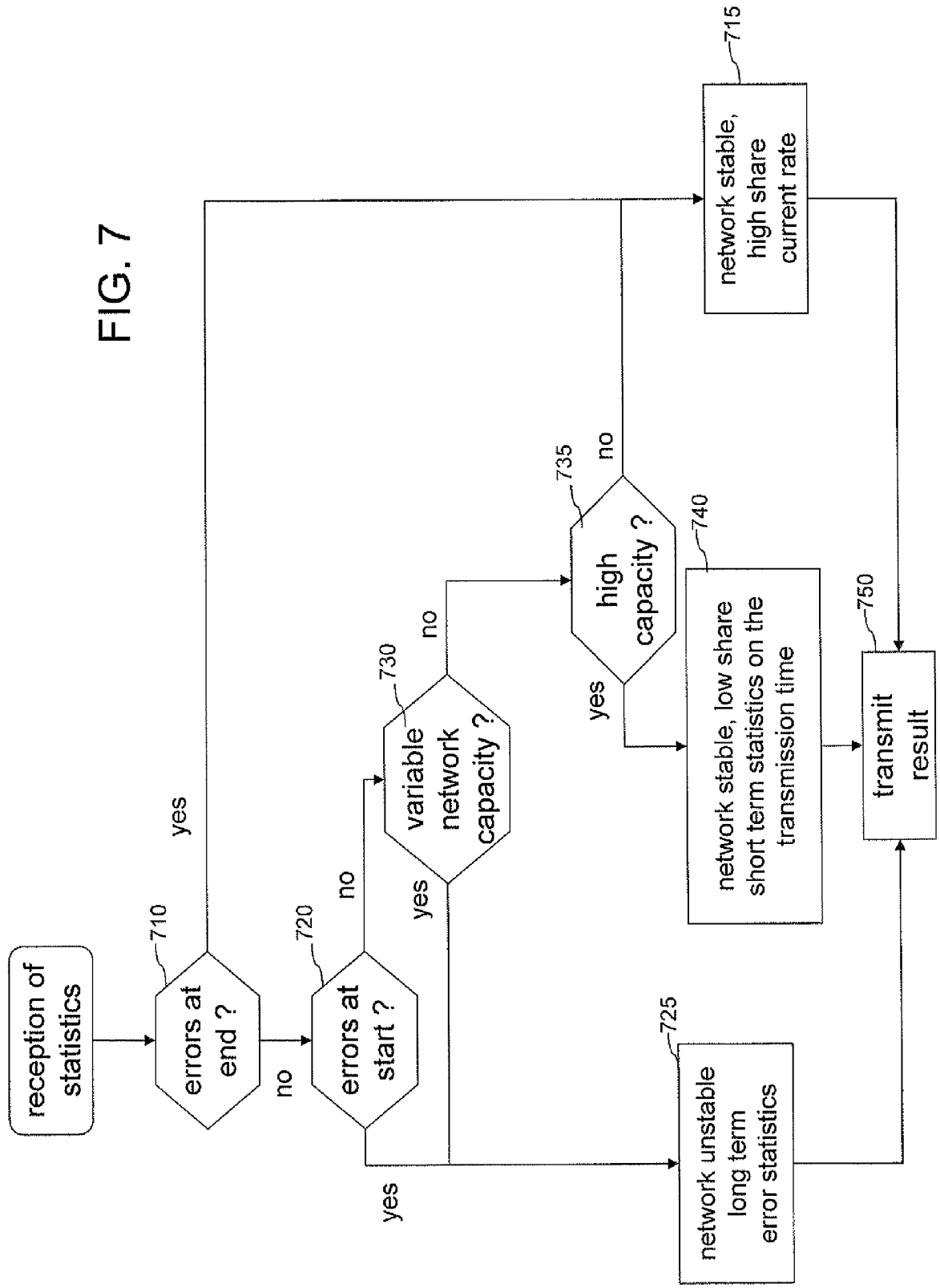
FIG. 7 is a flowchart illustrating the main steps of the error prediction in accordance with the present invention, in a particular embodiment.

The flowchart of FIG. 7 illustrates the main steps of the analysis which is made of the statistics produced with the algorithm of FIGS. 6a and 6b with the object of making forecasts about the next errors. The objective is to distinguish several cases of very different networks then to calculate an estimate of the future errors in each of those cases.

On reception of the statistics, at the first step 710, the server analyzes the position of the errors.

For this, for each position in the groups of packets it is possible to calculate the proportion of packets lost relative to all the lost packets:

$$\frac{\text{loss}[n]}{\sum_i \text{loss}[i]}.$$

Figure 8:
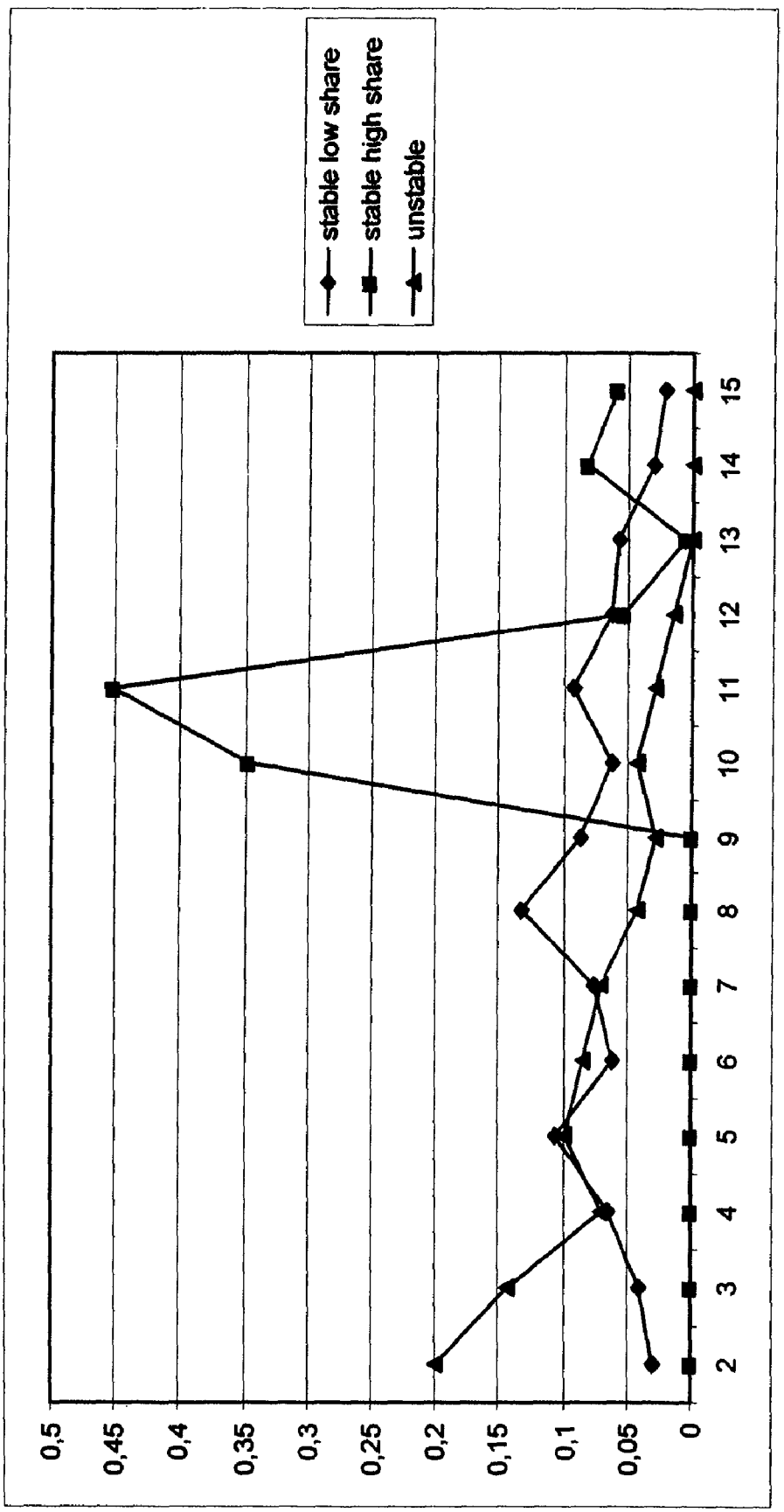
FIG. 8 is a graph illustrating several non-limiting examples of curves giving the proportion of errors according to the position of the data packets in a group of sent packets.

The graph of FIG. 8 shows three examples of error curves by position in the groups of data packets, obtained in simulations of different types of network.

In a network in which the congestions are mainly induced by the controlled stream, the errors are induced directly by the size of the groups of packets sent. In this case, the errors are mainly situated at the end of groups (curve with square points in FIG. 8). In such a network, the errors are directly induced by the behavior of the controlled stream and are thus easily predictable: they are directly linked to the rate or to the position of the packet.

Thus at step 710 the position of the errors in the groups of packets is tested. If the majority of the errors are located at the end of the groups (for example in the last quarter) (test 710 positive), step 715 is proceeded to for estimation of the errors in a stable network with a high share of the rate used by the controlled stream, that is to say a share of the rate used by the controlled stream greater than a first predetermined threshold.

In a network in which numerous streams are in competition with much faster reaction times than that of the controlled stream, the majority of the errors are located at the beginning of the groups of packets (curve with triangular points in FIG. 8) (test 710 negative and test 720 positive). In such a system, the errors are difficult to predict since opposing streams may react much faster than the controlled stream. Such a network is said to be of unstable type. Thus, at step 720, the position of the errors in the groups is tested to determine whether a majority is located at the beginning of the groups (for example in the first quarter). If that is the case, step 725 is proceeded to in order to evaluate the error probability in the unstable case.

If the errors are located neither at the beginning, nor at the end of the groups (tests 710 and 720 negative), the statistics on the transmission times are used to determine the type of network. At step 730, the capacity measurements calculated by the client are used. If the capacity measurements are very variable (test 730 positive), this indicates that the network is shared with numerous other streams with variable characteristics. The case of an unstable network analyzed at step 725 is then returned to.

If the capacity is precise (test 730 negative), this capacity can be compared to the rate calculated by the congestion control module 335, at a test 735. If the rate is low (for example less than 10% of the capacity) (test 735 positive), it is a case of a stable network with a small share of the rate used by the media (curve with diamond shaped points in FIG. 8), that is to say a share of the rate used by the controlled stream less than a second predetermined threshold, which case is analyzed at step 740; otherwise it is a case of a stable network with a high share of the rate for the controlled media stream (step 715).

In the case of an unstable network (step 725), the estimations cannot be precise. Statistics over the long-term (over several past minutes) on the number of errors are thus simply used to calculate an error probability. The future error rate is predicted as being equal to the average error rate of the past. It is known however that this estimation is not precise. This double information (the rate and the fact that the prediction is imprecise) is transmitted to the client modules (step 750), that is to say to the modules of the server using that information, i.e. the rate control module 320 and the packet scheduler module 330.

In the case of a stable network with a small rate share available for the controlled media stream (step 740), it is possible to use the statistics over the very short-term. This is because the operation of the network and of the competing streams is compatible with the reaction speed of the server. It is thus possible to use the information from the most recent seconds as prediction of the future behavior. In particular, the evolutions of the transfer time between the server and the client (D) are known to be a good predictor of the error rate, (see for example the paper by L. Roychoudhuri et al. cited in the introduction). An estimation may thus be calculated of the future error rate with a good level of confidence. This information is next transmitted to the client modules (step 750).

In the last case, there is a stable network which is used to a high extent by the media stream (step 715). In this case, the congestions are directly induced by the evolutions of the rate of the stream. The errors in this case are directly linked to the rate of the stream and to the position of the packets in the groups of packets. Given that, in the algorithm of FIG. 5*b*, the size of the groups of packets is calculated on the basis of the rate, it is possible in this case only to use the error statistics by position as prediction of the future error rate with a good level of confidence. This information is transmitted to the client modules (step 750).

The flowchart of FIG. 9 illustrates the operation of the rate control module 320 of the server.

The module 320 uses the information on estimation of the future errors obtained through the algorithm of FIG. 7, received at step 910.

If, at a test 920, these estimations are considered to be of low reliability (that is to say if these items of information have been calculated at step 725 of FIG. 7), the intra mode is passed to at step 925.

This is because, as the predictions are of low precision, an error correction system or FEC (Forward Error Correction) may prove to provide poor performance since the error rate may often exceed the correction capacities of FECs. More particularly, conventionally, error correcting codes cannot correct more than a fixed number of errors. Beyond that error rate, they no longer correct anything, and the FEC information becomes unusable. In this case, a redundant coding mode may thus be preferred since any correctly transmitted information will make it possible to improve the quality of the received stream.

At step 925, the rate control module 320 thus chooses a coding mode with more frequent intra macroblocks. The proportion of intra macroblocks is chosen to withstand the predicted error rate. In simple manner, it is possible to use the predicted error rate as a proportion of intra macroblocks disposed randomly in the video stream.

If, at the test 920, the predictions are evaluated as reliable (test 920 positive), test 930 is proceeded to in order to know whether it is a fixed error rate or an error rate that is variable with position.

If the error rate is fixed (test 930 positive), step 940 is proceeded to, at which packets of Reed-Solomon correcting code type are chosen in sufficient number to withstand the predicted error rate.

If the error rate is not fixed (test 930 negative), a fountain code may be used, for example by using the algorithms of Digital Fountain type, to calculate a high number of redundancy packets (step 935).

The packets are then transmitted to the packet scheduler module 330.

Thus, the server selects a predictive method of error correction depending on the predicted transmission error rate and on the reliability of that prediction.

The flowchart of FIG. 10 shows the algorithm for selecting packets at step 530 of FIG. 5, this selection being carried out by the packet scheduler module 330. Module 330 also uses the information on error prediction, that came from the algorithm of FIG. 7, received at step 1010.

If the predictions are considered as unreliable (test 1020 negative), the selection is made simply by taking all the packets in the order of arrival, that is to say in FIFO (First In First Out) mode (step 1025). The error rate has already been taken into account in the rate control of the coding.

If the predictions are considered as reliable and the error rate is fixed (tests 1020 and 1030 positive), the same simple selection is used at step 1025.

If the error rate depends on the position in the groups (test 1020 positive and test 1030 negative), an overall error rate is calculated on the basis of the number of packets at each position (step 1040).

It is next possible to select the number of adapted redundancy packets from among the redundancy packets calculated by the coder (step 1045). Thus, the predicted error rate makes it possible to choose a redundancy rate that is appropriate for the correction of the errors.

Moreover, if information is possessed on the importance of the packets, it is also possible to choose the positions of the packets to place the most important packets at the positions where the probabilities of error are the lowest.

It is to be noted that the use of the prediction of the error rate for calculating FECs only constitutes one application among others of the present invention. For example, the prediction of the error rate may also be used for the creation of enhancement layers, where the data are of video type.

What is claimed is:
1. A method of predicting the transmission error rate in a stream of data packets transmitted between a server and at least one client in a communication network, wherein said method comprises the steps of:

sending, by the server to the client, at least one group of packets;

calculating, by the client, a plurality of items of statistical information on the group of packets and transmitting, by the client, said items of statistical information to the server;

analyzing, by the server, said statistical information, wherein said analyzing comprises determining a position of errors in the group of packets so as to obtain a network stability indicator; and calculating, by the server, a prediction of said transmission error rate on the basis of said network stability indicator.

2. A method according to claim 1, wherein if the server determines in the analyzing step that a majority of the errors is situated at the end of the groups, the network stability indictor indicates that the network is of a stable type.

3. A method according to claim 1, wherein if the server determines in the analyzing step that a majority of the errors is situated at the beginning of the groups, the network stability indictor indicates that the network is of an unstable type.

4. A method according to claim 1, wherein the client calculates in the calculating step a capacity of the network for each packet of the group of packets, defined by $B_i=S_i/d_i$, where $S_i$ is a size of the packet and $d_i$ is a variation, between two consecutive packets, of the transmission duration of a packet.

5. A method according to claim 4, wherein, at the step of analyzing the statistical information, the server analyzes the variations in measurement of the capacity of the network and deduces therefrom the network stability indicator.

6. A method according to claim 4, wherein, at the step of analyzing the statistical information, the server compares the capacity of the network with a rate of the stream over the network and deduces therefrom the network stability indicator.

7. A method according to claim 1, wherein, if the network stability indicator indicates that the network is of an unstable type, the server calculates a prediction of the error rate on the basis of long term statistics on the number of errors in the past.

8. A method according to claim 1, wherein, if the network stability indicator indicates that the network is of a stable type with a share of the rate used by the stream of data packets greater than a first predetermined threshold, the server calculates a prediction of the error rate on the basis of statistics on the position of the errors in the group of packets, and if the network stability indicator indicates that the network is of the stable type with a share of the rate used by the stream of data packets less than a second predetermined threshold, the server calculates a prediction of the error rate on the basis of short term statistics on the evolution of the transmission duration of the packets.

9. A method according to claim 1, further comprising a step of determining, by the server, a reliability of the prediction of the transmission error rate on the basis of said network stability indicator.

10. A method according to claim 9, wherein the server selects a predictive error correction method on the basis of the prediction of the transmission error rate and of the reliability of said prediction.

11. A method according to claim 10, wherein the server chooses a predetermined redundancy rate for an error correction method on the basis of the prediction of the transmission error rate and of the reliability of the prediction.

12. A method according to claim 10, in which the data are video data, wherein the server chooses an intra coding mode for the data depending on the prediction of the transmission error rate and on the reliability of the prediction.

13. A server for transmitting a stream of data packets, in a communication network comprising at least one client and said server, wherein said server comprises:

a memory on which is stored computer-executable code of a computer program, and at least one processor that executes the code so as to perform the steps of:

sending at least one group of packets to the client;

receiving a plurality of items of statistical information on the group of packets, the statistical information being calculated by the client;

analyzing said statistical information, wherein said analyzing comprises determining a position of the errors in the group of packets so as to obtain a network stability indicator; and calculating a prediction of the transmission error rate on the basis of said network stability indicator.

14. A server according to claim 13, further comprising analyzing variations in measurement of a capacity of the network and for deducing therefrom the network stability indicator, the capacity of the network being defined, for each packet of the group of packets, by $B_i=S_i/d_i$, where $S_i$ is a size of the packet and $d_i$ is a variation, between two consecutive packets, of the transmission duration of a packet.

15. A server according to claim 13, further comprising comparing a capacity of the network with a rate of the stream over the network and deducing therefrom the network stability indicator, the capacity of the network being defined, for each packet of the group of packets, by $B_i=S_i/d_i$, where $S_i$ is size of the packet and $d_i$ is a variation, between two consecutive packets, of the transmission duration of a packet.

16. A server according to claim 13, wherein said calculating step calculates a prediction of the transmission error rate on the basis of long term statistics on a number of errors in the past, if the network stability indicator indicates that the network is of an unstable type.

17. A server according to claim 13, wherein said calculating step calculates a prediction of the transmission error rate on the basis of statistics on the position of the errors in the group of packets, if the network stability indicator indicates that the network is of a stable type with a share of the rate used by the stream of data packets greater than a first predetermined threshold, and calculates a prediction of the transmission error rate on the basis of short term statistics on the evolution of the transmission duration of the packets, if the network stability indicator indicates that the network is of the stable type with a share of the rate used by the stream of data packets less than a second predetermined threshold.

18. A server according to claim 13, further comprising determining a reliability of the prediction of the transmission error rate on the basis of said network stability indicator.

19. A server according to claim 18, further comprising selecting a predictive error correction method on the basis of the prediction of the transmission error rate and of the reliability of said prediction.

20. A server according to claim 19, further comprising choosing a predetermined redundancy rate for an error correction method on the basis of the prediction of the transmission error rate and of the reliability of the prediction.

21. A server according to claim 19, wherein the data packets are video data, and further comprising choosing an intra-coding mode for the video data on the basis of the prediction of the transmission error rate and of the reliability of said prediction.

22. A non-transitory computer-readable storage means medium which can be read by a computer or a microprocessor, the storage medium storing computer-executable code of a computer program that, when executed in a computer network, implements a method of predicting the transmission error rate in a stream of data packets transmitted between a server and at least one client in a communication network, wherein code, when executed, performing the steps of:

sending, by the server to the client, at least one group of packets;

calculating, by the client, a plurality of items of statistical information on the group of packets and transmitting, by the client, said items of statistical information to the server;

analyzing, by the server, said statistical information, wherein said analyzing comprises determining a position of errors in the group of packets so as to obtain a network stability indicator; and calculating, by the server, a prediction of said transmission error rate on the basis of said network stability indicator.

* * * * *